(12) United States Patent
Lu et al.

(10) Patent No.: US 10,490,342 B2
(45) Date of Patent: Nov. 26, 2019

(54) SYNCHRONOUS RECTIFICATION MODULE

(71) Applicant: Delta Electronics (Thailand) Public Company Limited, Samutprakarn (TH)

(72) Inventors: Hao Lu, Samutprakarn (TH); Tianding Hong, Samutprakarn (TH); Tao Zhang, Samutprakarn (TH); Bo Shen, Samutprakarn (TH); Zhongwei Ke, Samutprakarn (TH)

(73) Assignee: DELTA ELECTRONICS (THAILAND) PUBLIC COMPANY LIMITED, Samutprakarn (TH)

( * ) Notice: Subject to any disclaimer, the term of this patent is extended or adjusted under 35 U.S.C. 154(b) by 0 days.

(21) Appl. No.: 16/006,606

(22) Filed: Jun. 12, 2018

(65) Prior Publication Data

US 2019/0148061 A1 May 16, 2019

(30) Foreign Application Priority Data

Nov. 10, 2017 (CN) .......................... 2017 1 1105799

(51) Int. Cl.
*H01F 27/00* (2006.01)
*H01F 27/40* (2006.01)
(Continued)

(52) U.S. Cl.
CPC ............. *H01F 27/40* (2013.01); *H01F 27/24* (2013.01); *H01F 27/263* (2013.01);
(Continued)

(58) Field of Classification Search
CPC .......... H01F 27/40; H01F 27/24; H01F 27/28; H01F 27/263; H01F 27/266; H01F 27/2847; H01F 27/306; H01F 27/38; H01F 2027/408; H02M 7/003; H05K 1/14; H05K 2201/1003
See application file for complete search history.

(56) References Cited

U.S. PATENT DOCUMENTS

| 8,964,410 B2* | 2/2015 | Chang | ...................... | H05K 1/18 336/123 |
| 2013/0077276 A1* | 3/2013 | Kippley | .................. | H02M 3/00 361/784 |
| 2015/0310979 A1 | 10/2015 | Pan | | |

FOREIGN PATENT DOCUMENTS

CN         102522187 A      6/2012

* cited by examiner

*Primary Examiner* — Pete T Lee
(74) *Attorney, Agent, or Firm* — Kirton McConkie; Evan R. Witt

(57) ABSTRACT

A synchronous rectification module includes a transformer, a first conducting member and a synchronous rectification unit. The transformer includes plural secondary winding assemblies. The outlet ends of the secondary winding assemblies are protruded out from a first lateral region and a second lateral region of the transformer. The first conducting member is located at a third lateral region of the transformer. The synchronous rectification unit includes a first circuit board and a second circuit board. The first circuit board is connected with the first conducting member and located at the first lateral region. The second circuit board is connected with the first conducting member and located at the second lateral region. The outlet ends of the secondary winding assemblies are penetrated through corresponding first insertion holes of the first circuit board and corresponding second insertion holes of the second circuit board.

15 Claims, 8 Drawing Sheets

(51) Int. Cl.
*H01F 27/28* (2006.01)
*H02M 7/00* (2006.01)
*H05K 1/14* (2006.01)
*H01F 27/24* (2006.01)
*H01F 27/26* (2006.01)
*H01F 27/30* (2006.01)
*H01F 27/38* (2006.01)

(52) U.S. Cl.
CPC ............ *H01F 27/266* (2013.01); *H01F 27/28* (2013.01); *H01F 27/2847* (2013.01); *H01F 27/306* (2013.01); *H01F 27/38* (2013.01); *H02M 7/003* (2013.01); *H05K 1/14* (2013.01); *H01F 2027/408* (2013.01); *H05K 2201/1003* (2013.01)

SYNCHRONOUS RECTIFICATION MODULE

CROSS-REFERENCE TO RELATED APPLICATION

This application claims priority to China Patent Application No. 201711105799.0, filed on Nov. 10, 2017, the entire contents of which are incorporated herein by reference for all purposes.

FIELD OF THE DISCLOSURE

The present disclosure relates to a synchronous rectification module, and more particularly to a synchronous rectification module with enhanced heat dissipating efficiency and reduced power loss.

BACKGROUND OF THE DISCLOSURE

In Datacenter power supply application area, high power density and high efficiency are two key technology driven facts. To achieve high power density and high efficiency, a synchronous rectification module is used, especially for low-voltage and large-current applications. Generally, the synchronous rectification module comprises a transformer, a synchronous rectification unit and a filtering unit. After the electric energy from the transformer is rectified by the synchronous rectification unit, the electric energy is transmitted to the filtering unit and filtered by the filtering unit.

However, the conventional synchronous rectification module still has some drawback. Firstly, the heat from the synchronous rectification unit is concentrated and the heat dissipating efficiency is low. Secondly, the power loss is high. For solving the first drawback, a heat sink is attached on the synchronous rectification unit. As known, it is difficult to install the heat sink. For solving the second drawback, a large-area copper bus bar is used to connect the transformer with the synchronous rectification unit in order to reduce the AC impedance and the influence of the proximity effect. However, these two approaches cannot effectively increase the space utilization, the power density and the efficiency of the synchronous rectification module.

Therefore, there is a need of providing an improved synchronous rectification module in order to solve the drawbacks of the conventional technologies.

SUMMARY OF THE DISCLOSURE

An object of the present disclosure provides a synchronous rectification module. The outlet ends of the secondary winding assemblies of the transformer are protruded out from a first lateral region and a second lateral region of the transformer, and connected with a first circuit board and a second circuit board. Moreover, a first conducting member is located at a third lateral region of the transformer and connected with a synchronous rectification unit. The synchronous rectification module is capable of dissipating away the heat and reducing the power loss.

In accordance with an aspect of the present disclosure, there is provided a synchronous rectification module. The synchronous rectification module includes a transformer, a first conducting member and a synchronous rectification unit. The transformer includes plural secondary winding assemblies. Each of the secondary winding assemblies includes plural outlet ends. The outlet ends of portion of the secondary winding assemblies are protruded out from a first lateral region of the transformer, and the outlet ends of the other portion of the secondary winding assemblies are protruded out from a second lateral region of the transformer. The first lateral region and the second lateral region are located at two opposite sides of the transformer. At least a portion of the first conducting member is located at a third lateral region of the transformer. The third lateral region is arranged between the first lateral region and the second lateral region. The synchronous rectification unit includes a first circuit board and a second circuit board. The first circuit board is connected with the first conducting member and located at the first lateral region. The second circuit board is connected with the first conducting member and located at the second lateral region. Plural electronic components are installed on the first circuit board and the second circuit board. The first circuit board includes plural first insertion holes. The second circuit board includes plural second insertion holes. The outlet ends of the secondary winding assemblies are penetrated through the corresponding first insertion holes and the corresponding second insertion holes.

From the above descriptions, the present disclosure provides the synchronous rectification module. The transformer, the first conducting member and the synchronous rectification unit are combined as an integrated structure. The outlet ends of the secondary winding assemblies of the transformer are protruded out from the first lateral region and the second lateral region of the transformer, and connected with the first circuit board and the second circuit board. The first conducting member is located at the third lateral region of the transformer and connected with the synchronous rectification unit. During the operation of the synchronous rectification module, the heat from the transformer and the synchronous rectification unit is dispersedly transferred to the first lateral region, the second lateral region and the third lateral region of the transformer. Since the overall heat transfer area of the synchronous rectification module is increased, the heat generated by the synchronous rectification module can be dissipated away more easily. In other words, the synchronous rectification module has enhanced heat dissipating efficiency. Moreover, the outlet ends of the secondary winding assemblies of the transformer are directly connected with the first circuit board and the second circuit board of the synchronous rectification unit. In other words, it is not necessary to use the large-area copper bus bar to connect the transformer and the synchronous rectification unit. Since the AC path of the loop is shortened, the power loss caused by the proximity effect is minimized.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
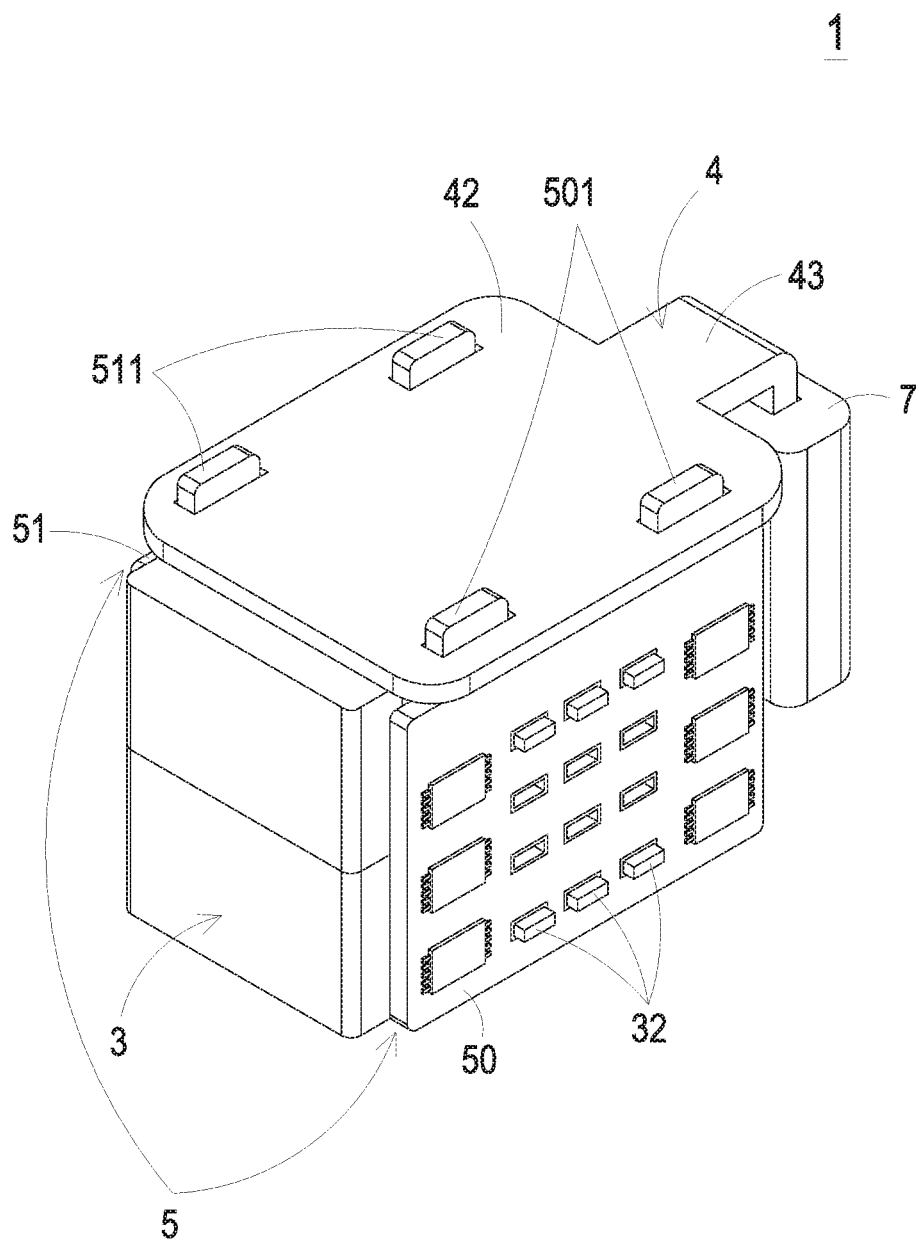
FIG. 1 is a schematic perspective view illustrating a synchronous rectification module according to a first embodiment of the present disclosure.
Figure 2:
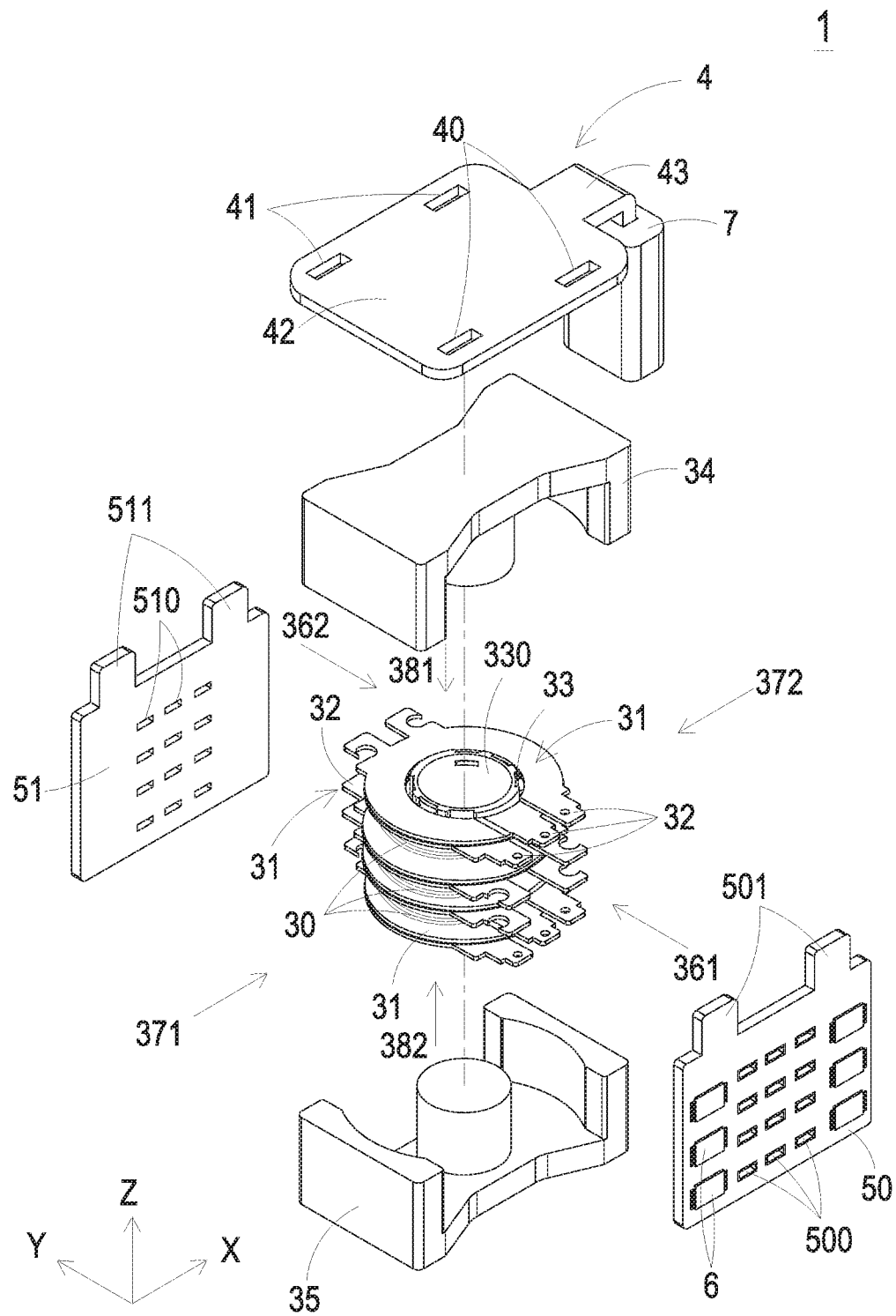
FIG. 2 is a schematic exploded view illustrating the synchronous rectification module as shown in FIG. 1.

FIG. 1 is a schematic perspective view illustrating a synchronous rectification module according to a first embodiment of the present disclosure. FIG. 2 is a schematic exploded view illustrating the synchronous rectification module as shown in FIG. 1. The synchronous rectification module 1 is installed on a main board (not shown). In this embodiment, the synchronous rectification module 1 comprises a transformer 3, a first conducting member 4 and a synchronous rectification unit 5.

The transformer 3 comprises plural primary winding assemblies 30 and plural secondary winding assemblies 31. Each of the primary winding assemblies 30 is a winding coil. Each of the secondary winding assemblies 31 is a ring-shaped conductive plate. According to an electromagnetic coupling effect, the input electric energy from the primary winding assemblies 30 are converted into the output electric energy by the corresponding secondary winding assemblies 31. Each of the secondary winding assemblies 31 comprises plural outlet ends 32. The outlet ends 32 are used as the output terminals of the corresponding secondary winding assembly 31. Consequently, the output electric energy from the secondary winding assembly 31 is outputted from the outlet ends 32. The outlet ends 32 of some secondary winding assemblies 31 are protruded out from a first lateral region 361 of the transformer 3. The outlet ends 32 of the other secondary winding assemblies 31 are protruded out from a second lateral region 362 of the transformer 3. The first lateral region 361 and the second lateral region 362 are located at two opposite sides of the transformer 3 along the y-axis direction. The transformer 3 further has a fifth lateral region 371 and a sixth lateral region 372. The fifth lateral region 371 and the sixth lateral region 372 are located at two opposite sides of the transformer 3 along the x-axis direction. The transformer 3 further has a third lateral region 381 and a fourth lateral region 382. The third lateral region 381 and the fourth lateral region 382 are located at two opposite sides of the transformer 3 along the z-axis direction. The x-axis direction, the y-axis direction and the z-axis direction are perpendicular to each other. The first lateral region 361, the second lateral region 362, the fifth lateral region 371 and the sixth lateral region 372 are arranged between the third lateral region 381 and the fourth lateral region 382. The third lateral region 381, the fourth lateral region 382, the fifth lateral region 371 and the sixth lateral region 372 are arranged between the first lateral region 361 and the second lateral region 362. The first lateral region 361, the second lateral region 362, the third lateral region 381 and the fourth lateral region 382 are arranged between the fifth lateral region 371 and the sixth lateral region 372.

The first conducting member 4 is made of an electrically-conductive and thermally-conductive material such as copper. At least a portion of the first conducting member 4 is located at the third lateral region 381 of the transformer 3.

The synchronous rectification unit 5 is electrically connected with the first conducting member 4 and the outlet ends 32 of the secondary winding assemblies 31. After the output electric energy from the secondary winding assemblies 31 is received by the synchronous rectification unit 5 through the outlet ends 32, the output electric energy is rectified by the synchronous rectification unit 5. In an embodiment, the synchronous rectification unit 5 comprises a first circuit board 50 and a second circuit board 51. The first circuit board 50 and the second circuit board 51 are connected with two opposite edges of the first conducting member 4, respectively. Consequently, the first circuit board 50 and the second circuit board 51 are fixed on the first lateral region 361 and the second lateral region 362 of the transformer 3. The synchronous rectification unit 5 further comprises plural electronic components 6. For example, the electronic components 6 include diodes, transistor switches, and so on. In one embodiment, some electronic components 6 are installed on a surface (e.g., an external surface) of the first circuit board 50. The other electronic components 6 are installed on a surface (e.g., an external surface) of the second circuit board 51. But it is not limited to this. In other embodiment, some electronic components 6 may be installed on two surfaces (e.g., an external surface and an internal surface) of the first circuit board 50. The other electronic components 6 may be installed on two surfaces (e.g., an external surface and an internal surface) of the second circuit board 51. The first circuit board 50 further comprises plural first insertion holes 500. The second circuit board 51 further comprises plural second insertion holes 510. The outlet ends 32 of the secondary winding assemblies 31 that are protruded out of the first lateral region 361 of the transformer 3 are penetrated through the corresponding first insertion holes 500. The outlet ends 32 of the secondary winding assemblies 31 that are protruded out of the second lateral region 362 of the transformer 3 are penetrated through the corresponding second insertion holes 510.

From the above descriptions, the transformer 3 and the synchronous rectification unit 5 are integrated into the synchronous rectification module 1. Moreover, the outlet ends 32 of the secondary winding assemblies 31 are protruded out of the first lateral region 361 and the second lateral region 362 of the transformer 3 and connected with the first circuit board 50 and the second circuit board 51. Moreover, the first conducting member 4 is located at the third lateral region 381 of the transformer 3 and connected with the synchronous rectification unit 5. During the operation of the synchronous rectification module 1, the heat from the transformer 3 and the synchronous rectification unit 5 is dispersedly transferred to the first lateral region 361, the second lateral region 362 and the third lateral region 381 of the transformer 3. Since the overall heat transfer area of the synchronous rectification module 1 is increased, the heat generated by the synchronous rectification module 1 can be dissipated away more easily.

In some embodiments, a fan (not shown) is located at the fifth lateral region 371 of the transformer 3, and the fan produces airflow toward the sixth lateral region 372 of the transformer 3. In some other embodiments, a fan (not shown) is located at the sixth lateral region 372 of the transformer 3, and the fan produces airflow toward the fifth lateral region 371 of the transformer 3. In such way, the heat dissipating efficiency of the synchronous rectification module 1 is further increased.

As mentioned above, the outlet ends 32 of the secondary winding assemblies 31 of the transformer 3 are directly connected with the first circuit board 50 and the second circuit board 51 of the synchronous rectification unit 5. In other words, it is not necessary to use the large-area copper bus bar to connect the transformer and the synchronous rectification unit. Since the AC path of the loop is shortened, the power loss caused by the proximity effect is minimized.

Figure 3:
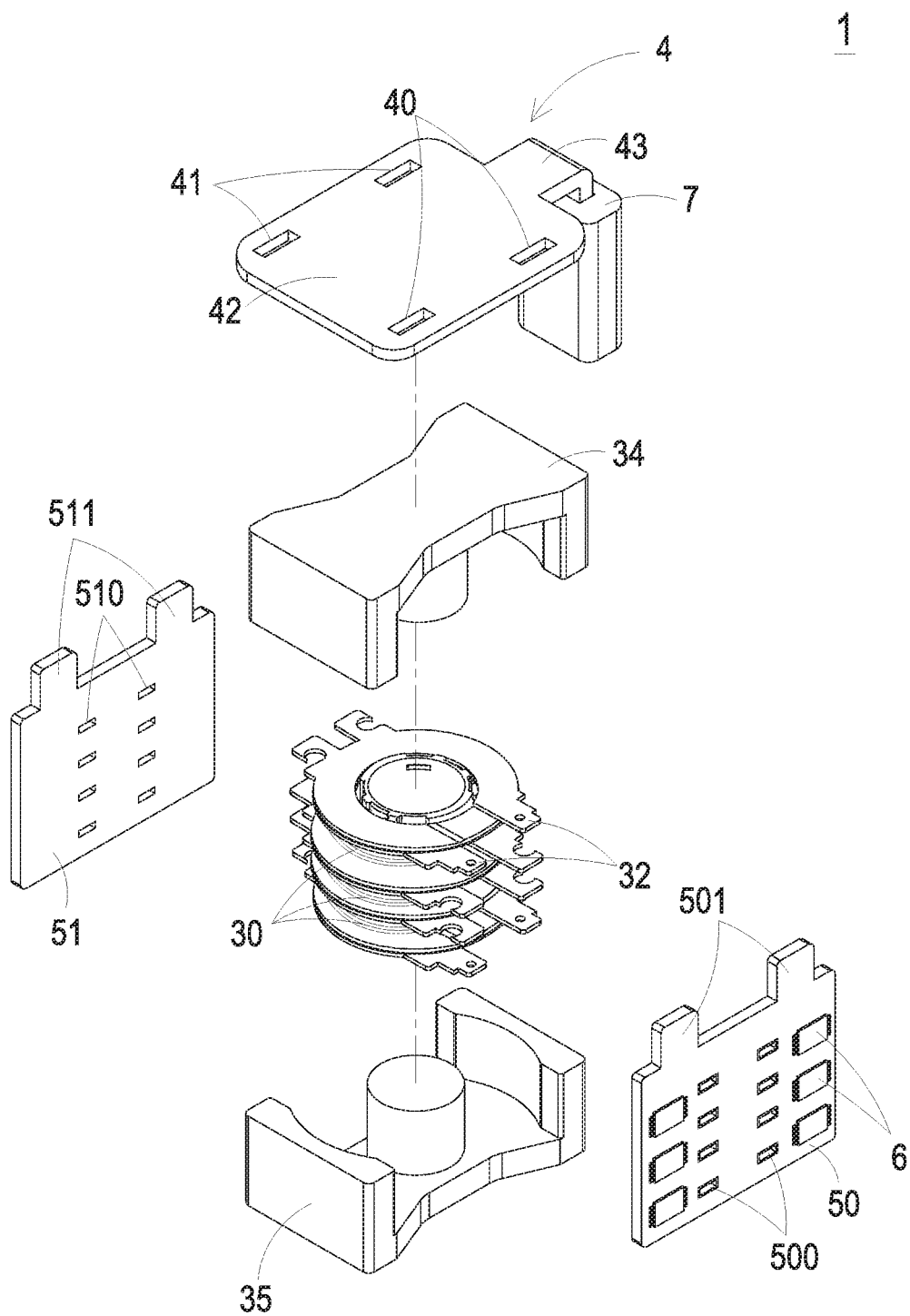
FIG. 3 is a schematic exploded view illustrating a synchronous rectification module according to a second embodiment of the present disclosure.

In some embodiments, the secondary winding assemblies 31 of the transformer 3 are connected with each other in series or in parallel. In the embodiment as shown in FIGS. 1 and 2, the transformer 3 has a central tap structure. Consequently, each of the secondary winding assemblies 31 has three outlet ends 32. FIG. 3 is a schematic exploded view illustrating a synchronous rectification module according to a second embodiment of the present disclosure. In this embodiment, each secondary winding assembly 31 of the transformer 3 comprises two outlet ends 32. The other components of the synchronous rectification module of this embodiment are similar to those of the first embodiment, and are not redundantly described herein.

Please refer to FIGS. 1 and 2 again. The first conducting member 4 further comprises at least one first coupling part 40 (e.g., at least one slot) and at least one second coupling part 41 (e.g., at least one slot). The first coupling part 40 is arranged beside the first lateral region 361 of the transformer 3. The second coupling part 41 is arranged beside the second lateral region 362 of the transformer 3. The first circuit board 50 comprises at least one third coupling part 501 corresponding to the at least one first coupling part 40. The second circuit board 51 comprises at least one fourth coupling part 511 corresponding to the at least one second coupling part 41. The at least one third coupling part 501 is aligned with the at least one first coupling part 40. The at least one fourth coupling part 511 is aligned with the at least one second coupling part 41. For example, the third coupling part 501 and the fourth coupling part 511 are bulges. After the third coupling part 501 and the fourth coupling part 511 are respectively inserted into and engaged with the first coupling part 40 and the second coupling part 41, the first conducting member 4 and the synchronous rectification unit 5 are combined together.

It is noted that numerous modifications and alterations may be made while retaining the teachings of the disclosure. For example, in another embodiment, the first coupling part 40 and the second coupling part 41 are bulges and the third coupling part 501 and the fourth coupling part 511 are slots.

The first conducting member 4 further comprises a first plate 42 and a second plate 43. The first plate 42 is a rectangular plate. The first plate 42 is located at the third lateral region 381 of the transformer 3. The first coupling part 40 and the second coupling part 41 are located at the first plate 42. The synchronous rectification module 1 further comprises a magnetic core 7 having a passage. The second plate 43 comprises a first segment, a bent structure and a second segment. The first segment of the second plate 43 is connected with the first plate 42. The bent structure is arranged between the first segment and the second segment. The second segment is connected with the bent structure and perpendicular to the first segment. In this embodiment, the second segment of the second plate 43 is arranged beside the sixth lateral region 372 of the transformer 3. Alternatively, the second segment of the second plate 43 is arranged beside the fifth lateral region 371 of the transformer 3. Moreover, the second segment of the second plate 43 is disposed in the passage of the magnetic core 7 so that the magnetic core 7 and the second segment of the second plate 43 are configured as a filtering inductor. After the electric energy is rectified by the electronic components 6 of the synchronous rectification unit 5, the electric energy is filtered by the filtering inductor. In this embodiment, the magnetic core 7 is arranged beside the fifth lateral region 371 or the sixth lateral region 372 of the transformer 3.

The transformer 3 further comprises a bobbin 33, a first magnetic core 34 and a second magnetic core 35. Preferably but not exclusively, the first magnetic core 34 and the second magnetic core 35 are E cores or PQ cores. The bobbin 33 comprises a winding section (not shown) and a hollow portion 330. The primary winding assemblies 30 are wound around the winding section. The secondary winding assemblies 31 are sheathed around the winding section. The first magnetic core 34 and the second magnetic core 35 are located at two opposite sides of the bobbin 33. Moreover, a middle leg of the first magnetic core 34 and a middle leg of the second magnetic core 35 are accommodated within the hollow portion 330.

Figure 4:
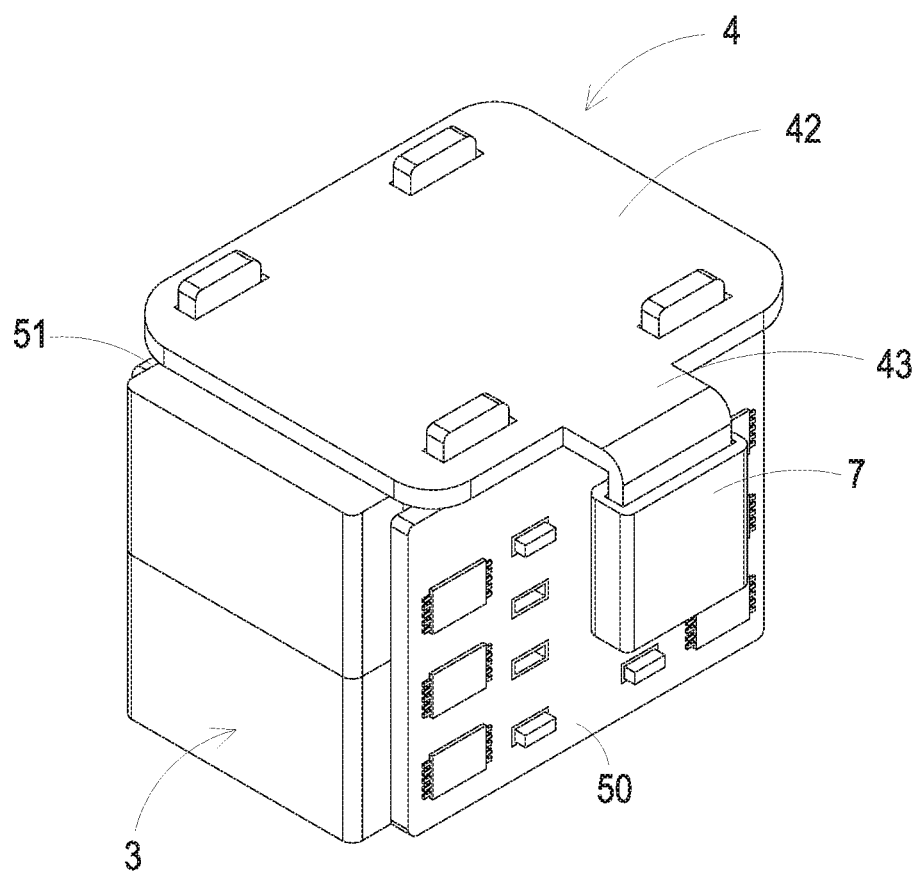
FIG. 4 is a schematic exploded view illustrating a synchronous rectification module according to a third embodiment of the present disclosure.

FIG. 4 is a schematic exploded view illustrating a synchronous rectification module according to a third embodiment of the present disclosure. In comparison with the first embodiment, the position of the second plate 43 of this embodiment is distinguished. In this embodiment, the second segment of the second plate 43 is arranged beside the first lateral region 361 of the transformer 3. Alternatively, the second segment of the second plate 43 is arranged beside the second lateral region 362 of the transformer 3. Moreover, the second segment of the second plate 43 is disposed in the passage of the magnetic core 7 so that the magnetic core 7 and the second segment of the second plate 43 are configured as a filtering inductor. In this embodiment, the magnetic core 7 is arranged beside the first lateral region 361 or the second lateral region 362 of the transformer 3. In case that the magnetic core 7 is arranged beside the first lateral region 361, the first circuit board 50 is arranged between the magnetic core 7 and the transformer 3. In case that the magnetic core 7 is arranged beside the second lateral region 362, the second circuit board 51 is arranged between the magnetic core 7 and the transformer 3.

Figure 5:
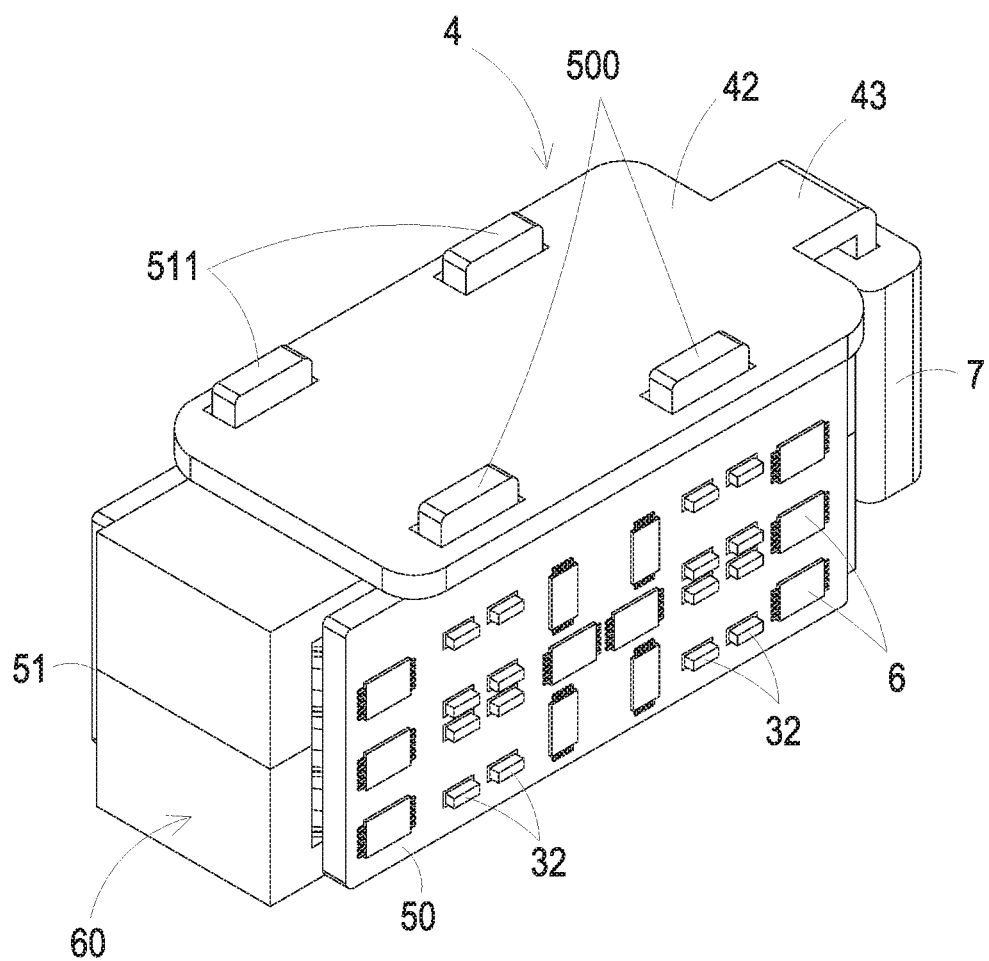
FIG. 5 is a schematic perspective view illustrating a synchronous rectification module according to a fourth embodiment of the present disclosure.
Figure 6:
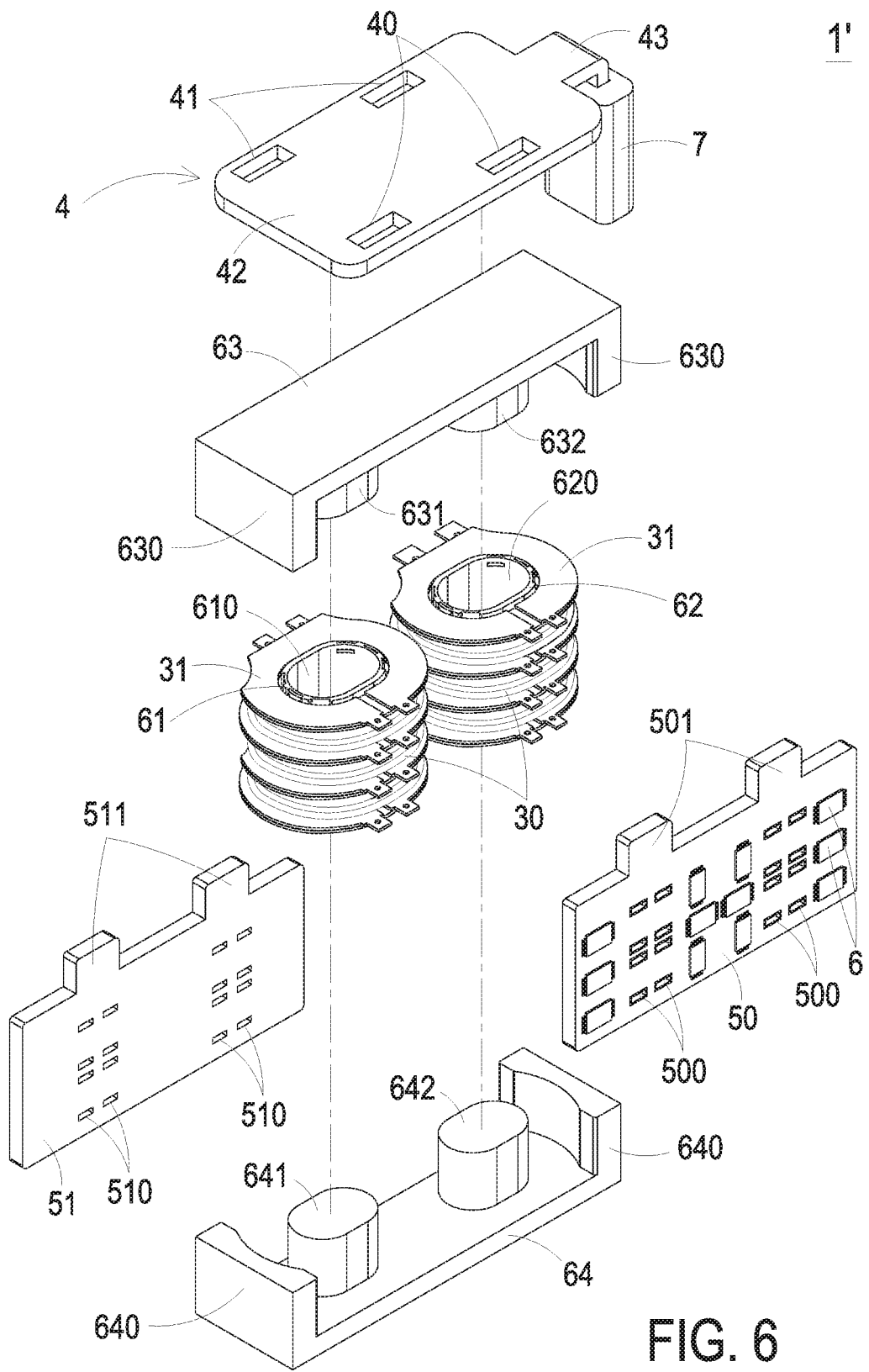
FIG. 6 is a schematic exploded view illustrating the synchronous rectification module as shown in FIG. 5.

FIG. 5 is a schematic perspective view illustrating a synchronous rectification module according to a fourth embodiment of the present disclosure. FIG. 6 is a schematic exploded view illustrating the synchronous rectification module as shown in FIG. 5. Component parts and elements corresponding to those of the first embodiment are designated by identical numeral references, and detailed descriptions thereof are omitted. In comparison with the first embodiment, the transformer 60 of the synchronous rectification module 1' of this embodiment is distinguished. In this embodiment, the transformer 60 comprises plural primary winding assemblies 30, plural secondary winding assemblies 31, a first bobbin 61, a second bobbin 62, a first magnetic core 63 and a second magnetic core 64. The first bobbin 61 comprises a first winding section (not shown) and a first hollow portion 610. The second bobbin 62 comprises a secondary winding section (not shown) and a second hollow portion 620. The primary winding assemblies 30 are wound around the corresponding first winding section and the corresponding secondary winding section. The secondary winding assemblies 31 are sheathed around the corresponding first winding section and the corresponding secondary winding section. The first magnetic core 63 and the second magnetic core 64 are located at two opposite sides of the first bobbin 61 and two opposite sides of the second bobbin 62. The first magnetic core 63 comprises two first lateral legs 630, a first middle leg 631 and a second middle leg 632. The first middle leg 631 and the second middle leg 632 are arranged between the two first lateral legs 630. The second magnetic core 64 comprises two second lateral legs 640, a third middle leg 641 and a fourth middle leg 642. The third middle leg 641 and the fourth middle leg 642 are arranged between the two second lateral legs 640. The first middle leg 631 and the third middle leg 641 are accommodated within the first hollow portion 610 of the first bobbin 61. The second middle leg 632 and the fourth middle leg 642 are accommodated within the second hollow portion 620 of the second bobbin 62.

Figure 7:
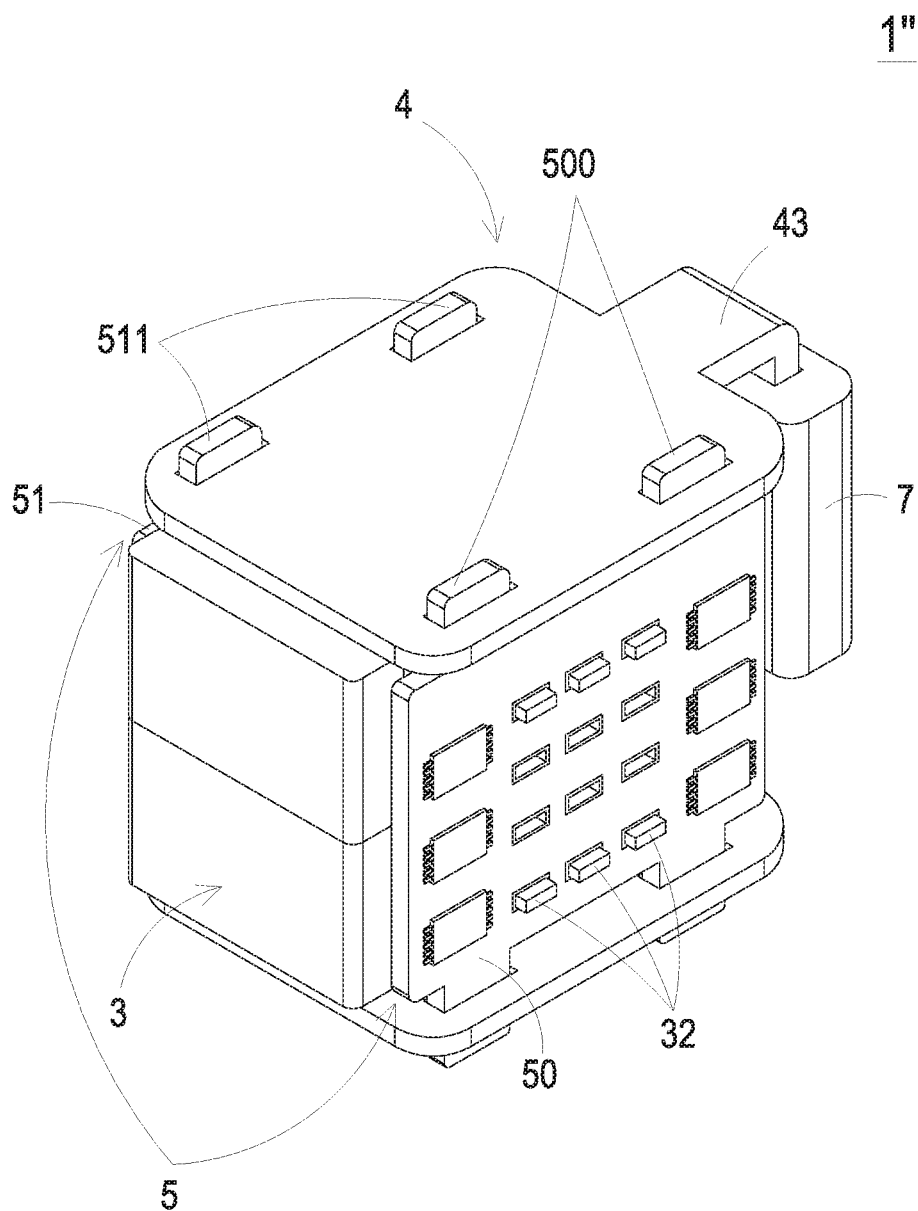
FIG. 7 is a schematic perspective view illustrating a synchronous rectification module according to a fifth embodiment of the present disclosure.
Figure 8:
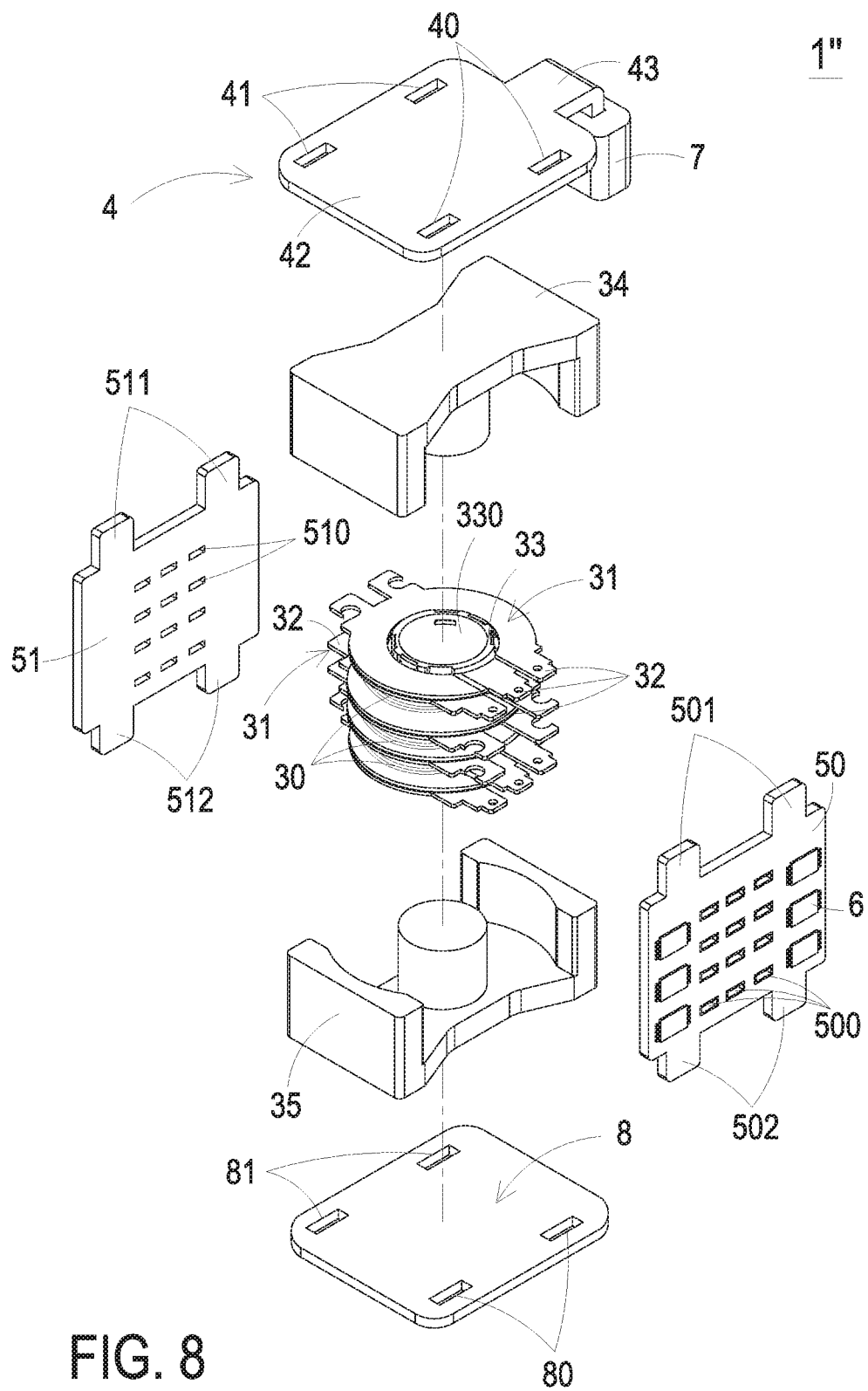
FIG. 8 is a schematic exploded view illustrating the synchronous rectification module as shown in FIG. 7.

FIG. 7 is a schematic perspective view illustrating a synchronous rectification module according to a fifth embodiment of the present disclosure. FIG. 8 is a schematic exploded view illustrating the synchronous rectification module as shown in FIG. 7. Component parts and elements corresponding to those of the first embodiment are designated by identical numeral references, and detailed descriptions thereof are omitted. In comparison with the first embodiment, the synchronous rectification module 1" of this embodiment further comprises a second conducting member 8. The second conducting member 8 is located at the fourth lateral region 382 of the transformer 3 and connected with the first circuit board 50 and the second circuit board 51.

The second conducting member 8 further comprises at least one fifth coupling part 80 (e.g., at least one slot) and at least one sixth coupling part 81 (e.g., at least one slot). The fifth coupling part 80 is arranged beside the first lateral region 361 of the transformer 3. The sixth coupling part 81 is arranged beside the second lateral region 362 of the transformer 3. The first circuit board 50 comprises at least one seventh coupling part 502 corresponding to the at least one fifth coupling part 80. The second circuit board 51 comprises at least one eighth coupling part 512 corresponding to the at least one sixth coupling part 81. The at least one seventh coupling part 502 is aligned with the at least one fifth coupling part 80. The at least one eighth coupling part 512 is aligned with the at least one sixth coupling part 81. For example, the seventh coupling part 502 and the eighth coupling part 512 are bulges. After the seventh coupling part 502 and the eighth coupling part 512 are respectively inserted into and engaged with the fifth coupling part 80 and the sixth coupling part 81, the second conducting member 8 and the synchronous rectification unit 5 are combined together.

It is noted that numerous modifications and alterations may be made while retaining the teachings of the disclosure. For example, in another embodiment, the fifth coupling part 80 and the sixth coupling part 81 are bulges and the seventh coupling part 502 and the eighth coupling part 512 are slots.

From the above descriptions, the present disclosure provides the synchronous rectification module. The transformer, the first conducting member and the synchronous rectification unit are combined as an integrated structure. The outlet ends of the secondary winding assemblies of the transformer are protruded out from the first lateral region and the second lateral region of the transformer, and connected with the first circuit board and the second circuit board. The first conducting member is located at the third lateral region of the transformer and connected with the synchronous rectification unit. During the operation of the synchronous rectification module, the heat from the transformer and the synchronous rectification unit is dispersedly transferred to the first lateral region, the second lateral region and the third lateral region of the transformer. Since the overall heat transfer area of the synchronous rectification module is increased, the heat generated by the synchronous rectification module can be dissipated away more easily. In other words, the synchronous rectification module has enhanced heat dissipating efficiency. Moreover, the outlet ends of the secondary winding assemblies of the transformer are directly connected with the first circuit board and the second circuit board of the synchronous rectification unit. In other words, it is not necessary to use the large-area copper bus bar to connect the transformer and the synchronous rectification unit. Since the AC path of the loop is shortened, the power loss caused by the proximity effect is minimized.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A synchronous rectification module, comprising:
a transformer comprising plural secondary winding assemblies, wherein each of the secondary winding assemblies comprises plural outlet ends, and the outlet ends of portion of the secondary winding assemblies are protruded out from a first lateral region of the transformer and the outlet ends of the other portion of the secondary winding assemblies are protruded out from a second lateral region of the transformer, wherein the first lateral region and the second lateral region are located at two opposite sides of the transformer;
a first conducting member, wherein at least a portion of the first conducting member is located at a third lateral region of the transformer, and the third lateral region is arranged between the first lateral region and the second lateral region;
a synchronous rectification unit comprising a first circuit board and a second circuit board, wherein the first circuit board is connected with the first conducting member and located at the first lateral region, the second circuit board is connected with the first conducting member and located at the second lateral region, plural electronic components are installed on the first circuit board and the second circuit board, the first circuit board comprises plural first insertion holes, the second circuit board comprises plural second insertion holes, and the outlet ends of the secondary winding assemblies are penetrated through the corresponding first insertion holes and the corresponding second insertion holes, and
a magnetic core having a passage, wherein the first conducting member is partially disposed in the passage of the magnetic core so as to form a filtering inductor.

2. The synchronous rectification module according to claim 1, wherein the transformer has a central tap structure, and each of the secondary winding assemblies comprises three outlet ends.

3. The synchronous rectification module according to claim 1, wherein each of the secondary winding assemblies comprises two outlet ends.

4. The synchronous rectification module according to claim 1, wherein the first conducting member further comprises a first coupling part and a second coupling part, the first circuit board comprises a third coupling part corresponding to the first coupling part, and the second circuit board comprises a fourth coupling part corresponding to the second coupling part, wherein the first coupling part is arranged beside the first lateral region of the transformer, the second coupling part is arranged beside the second lateral region of the transformer, the third coupling part is connected with the first coupling part, and the fourth coupling part is connected with the second coupling part.

5. The synchronous rectification module according to claim 4, wherein the first coupling part and the second coupling part are bulges, and the third coupling part and the fourth coupling part are slots.

6. The synchronous rectification module according to claim 4, wherein the first coupling part and the second coupling part are slots, and the third coupling part and the fourth coupling part are bulges.

7. The synchronous rectification module according to claim 4, wherein the first conducting member comprises a first plate, wherein the first plate is located at the third lateral region, and the first coupling part and the second coupling part are located at the first plate.

8. The synchronous rectification module according to claim 7, wherein the first conducting member further comprises a second plate with a first segment, a bent structure and a second segment, wherein the first segment of the second plate is connected with the first plate, the bent structure is arranged between the first segment and the second segment, and the second segment is connected with the bent structure and perpendicular to the first segment, wherein the second segment of the second plate is arranged beside the first lateral region, the second lateral region, a fifth lateral region or a sixth lateral region of the transformer, and the second segment of the second plate is disposed in the passage of the magnetic core so that the magnetic core and the second segment of the second plate are configured as the filtering inductor, wherein the first lateral region, the second lateral region, the fifth lateral region and the sixth lateral region are arranged between the third lateral region and a fourth lateral region, wherein the third lateral region, the fourth lateral region, the fifth lateral region and the sixth lateral region are arranged between the first lateral region and the second lateral region, wherein the first lateral region, the second lateral region, the third lateral region and the fourth lateral region are arranged between the fifth lateral region and the sixth lateral region.

9. The synchronous rectification module according to claim 1, wherein the secondary winding assemblies are connected with each other in series or in parallel.

10. The synchronous rectification module according to claim 1, wherein the first conducting member is made of copper.

11. The synchronous rectification module according to claim 1, wherein the synchronous rectification module further comprises a second conducting member, wherein the second conducting member is located at a sixth lateral region of the transformer, and the second conducting member is connected with the first circuit board and the second circuit board.

12. The synchronous rectification module according to claim 11, wherein the second conducting member is made of copper.

13. The synchronous rectification module according to claim 12, wherein the second conducting member further comprises a fifth coupling part and a sixth coupling part, the first circuit board comprises a seventh coupling part corresponding to the fifth coupling part, and the second circuit board comprises an eighth coupling part corresponding to the sixth coupling part, wherein the fifth coupling part is arranged beside the first lateral region of the transformer, the sixth coupling part is arranged beside the second lateral region of the transformer, the seventh coupling part is connected with the fifth coupling part, and the eighth coupling part is connected with the sixth coupling part.

14. The synchronous rectification module according to claim 1, wherein the transformer further comprises plural primary winding assemblies, a bobbin, a first magnetic core and a second magnetic core, and the bobbin comprises a winding section and a hollow portion, wherein the primary winding assemblies are wound around the winding section, the plural secondary winding assemblies are sheathed around the winding section, the first magnetic core and the second magnetic core are located at two opposite sides of the bobbin, and a middle leg of the first magnetic core and a middle leg of the second magnetic core are accommodated within the hollow portion.

15. The synchronous rectification module according to claim 1, wherein the transformer further comprises plural primary winding assemblies, a first bobbin, a second bobbin, a first magnetic core and a second magnetic core, the first bobbin comprises a first winding section and a first hollow portion, and the second bobbin comprises a secondary winding section and a second hollow portion, wherein the primary winding assemblies are wound around the first winding section and the second winding section, the plural secondary winding assemblies are sheathed around the first winding section and the second winding section, and the first magnetic core and the second magnetic core are located at two opposite sides of the first bobbin and two opposite sides of the second bobbin, wherein the first magnetic core comprises two first lateral legs, a first middle leg and a second middle leg, the first middle leg and the second middle leg are arranged between the two first lateral legs, the second magnetic core comprises two second lateral legs, a third middle leg and a fourth middle leg, the third middle leg and the fourth middle leg are arranged between the two second lateral legs, the first middle leg and the third middle leg are accommodated within the first hollow portion, and the second middle leg and the fourth middle leg are accommodated within the second hollow portion.

\* \* \* \* \*